United States Patent
King et al.

(10) Patent No.: US 8,941,316 B2
(45) Date of Patent: Jan. 27, 2015

(54) DUTY FACTOR PROBING OF A TRIAC-BASED DIMMER

(75) Inventors: Eric King, Dripping Springs, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 589 days.

(21) Appl. No.: 13/287,257

(22) Filed: Nov. 2, 2011

(65) Prior Publication Data

US 2012/0112651 A1    May 10, 2012

Related U.S. Application Data

(63) Continuation-in-part of application No. 13/194,531, filed on Jul. 29, 2011, and a continuation-in-part of application No. 12/858,164, filed on Aug. 17, 2010, now Pat. No. 8,569,972.

(60) Provisional application No. 61/410,269, filed on Nov. 4, 2010.

(51) Int. Cl.
*H05B 37/02* (2006.01)
*H05B 33/08* (2006.01)

(52) U.S. Cl.
CPC ........ *H05B 33/0815* (2013.01); *H05B 33/0845* (2013.01); *Y02B 20/346* (2013.01)
USPC ...................................................... 315/244

(58) Field of Classification Search
CPC ........ H05B 37/02; H05B 41/36; H05B 33/00; H05B 41/136; H05B 33/08
USPC ...... 315/360, 209 R, 291, 307, 224, 246, 247
See application file for complete search history.

(56) References Cited

U.S. PATENT DOCUMENTS

| 4,523,128 A | 6/1985 | Stamm et al. |
| 5,055,746 A | 10/1991 | Hu et al. |

(Continued)

FOREIGN PATENT DOCUMENTS

| EP | 1164819 | 12/2001 |
| EP | 2257124 A1 | 1/2010 |

(Continued)

OTHER PUBLICATIONS

Vainio, et al., "Digital Filtering for Robust 50/60 Hz Zero-Crossing Detectors", IEEE Transactions on Instrumentation and Measurement, Apr. 1996, vol. 45, No. 2, Piscataway, NJ, US.
Engdahl, Tomi, Light Dimmer Circuits, 1997-2000, 9 pages (pp. 1-9 in pdf), dowloaded from www.epanorama.net.
"Why Different Dimming Ranges?", 2003, 1 page, downloaded from http://www.lutron.com/TechnicalDocumentLibrary/LutronBallastpg3.pdf.

(Continued)

*Primary Examiner* — Minh D A
(74) *Attorney, Agent, or Firm* — Mitch Harris, Atty at Law, LLC; Andrew M. Harris (57) ABSTRACT

A power supply circuit for operating high-efficiency lighting devices from a thyristor-controlled dimmer determines the dimming value, i.e., the dimmer duty factor by periodically probing the dimmer output. A minimum conductance is applied across the output of the dimmer during probing intervals that begin at the turn-on time of the dimmer and last until enough information has been gathered to correctly predict a next zero crossing of the AC line voltage that supplies the input of the dimmer. The dimming value is determined from the time interval between the predicted zero-crossing and a next turn-on time of the dimmer. The probing can be performed at intervals of an odd number of half-cycles of the AC line frequency so that a DC offset is not introduced within internal timing circuits of the dimmer. The AC line frequency can also be determined from a time interval between the predicted zero crossings.

20 Claims, 5 Drawing Sheets

(56) References Cited

U.S. PATENT DOCUMENTS

| | | | |
|---|---|---|---|
| 5,319,301 | A | 6/1994 | Callahan et al. |
| 5,321,350 | A | 6/1994 | Haas |
| 5,430,635 | A | 7/1995 | Liu |
| 5,691,605 | A | 11/1997 | Xia et al. |
| 5,770,928 | A | 6/1998 | Chansky et al. |
| 6,043,635 | A | 3/2000 | Downey |
| 6,046,550 | A * | 4/2000 | Ference et al. ............ 315/291 |
| 6,091,205 | A | 7/2000 | Newman, Jr. et al. |
| 6,211,624 | B1 * | 4/2001 | Holzer ..................... 315/224 |
| 6,380,692 | B1 | 4/2002 | Newman, Jr. et al. |
| 6,407,514 | B1 | 6/2002 | Glaser et al. |
| 6,621,256 | B2 | 9/2003 | Muratov et al. |
| 6,713,974 | B2 | 3/2004 | Patchornik et al. |
| 6,858,995 | B2 | 2/2005 | Lee et al. |
| 6,900,599 | B2 | 5/2005 | Ribarich |
| 7,102,902 | B1 | 9/2006 | Brown et al. |
| 7,180,250 | B1 | 2/2007 | Gannon |
| 7,184,937 | B1 | 2/2007 | Su et al. |
| 7,288,902 | B1 | 10/2007 | Melanson |
| 7,656,103 | B2 | 2/2010 | Shteynberg et al. |
| 7,719,246 | B2 | 5/2010 | Melanson |
| 7,733,678 | B1 | 6/2010 | Notohamiprodjo et al. |
| 7,759,881 | B1 | 7/2010 | Melanson |
| 7,786,711 | B2 | 8/2010 | Wei et al. |
| 7,872,427 | B2 | 1/2011 | Scianna |
| 8,102,167 | B2 | 1/2012 | Irissou et al. |
| 8,115,419 | B2 | 2/2012 | Given et al. |
| 8,169,154 | B2 | 5/2012 | Thompson et al. |
| 8,212,491 | B2 | 7/2012 | Kost et al. |
| 8,212,492 | B2 | 7/2012 | Lam et al. |
| 8,222,832 | B2 | 7/2012 | Zheng et al. |
| 8,569,972 | B2 | 10/2013 | Melanson |
| 8,749,173 | B1 | 6/2014 | Melanson et al. |
| 2004/0105283 | A1 | 6/2004 | Schie et al. |
| 2004/0212321 | A1 | 10/2004 | Lys et al. |
| 2006/0022648 | A1 | 2/2006 | Ben-Yaakov et al. |
| 2006/0208669 | A1 | 9/2006 | Huynh et al. |
| 2007/0182338 | A1 | 8/2007 | Shteynberg et al. |
| 2007/0182347 | A1 | 8/2007 | Shteynberg |
| 2008/0018261 | A1 | 1/2008 | Kastner |
| 2008/0143266 | A1 | 6/2008 | Langer |
| 2008/0192509 | A1 | 8/2008 | Dhuyvetter et al. |
| 2008/0205103 | A1 | 8/2008 | Sutardja et al. |
| 2008/0224629 | A1 | 9/2008 | Melanson |
| 2008/0224633 | A1 | 9/2008 | Melanson |
| 2008/0224636 | A1 | 9/2008 | Melanson |
| 2009/0134817 | A1 | 5/2009 | Jurngwirth et al. |
| 2009/0195186 | A1 | 8/2009 | Guest et al. |
| 2009/0284182 | A1 | 11/2009 | Cencur |
| 2010/0002480 | A1 | 1/2010 | Huynh et al. |
| 2010/0013405 | A1 | 1/2010 | Thompson et al. |
| 2010/0013409 | A1 | 1/2010 | Quek et al. |
| 2010/0066328 | A1 | 3/2010 | Shimizu et al. |
| 2010/0164406 | A1 | 7/2010 | Kost et al. |
| 2010/0213859 | A1 | 8/2010 | Shteynberg et al. |
| 2010/0231136 | A1 * | 9/2010 | Reisenauer et al. ......... 315/276 |
| 2010/0244726 | A1 | 9/2010 | Melanson |
| 2011/0043133 | A1 | 2/2011 | Van Laanen et al. |
| 2011/0080110 | A1 | 4/2011 | Nuhfer et al. |
| 2011/0084622 | A1 | 4/2011 | Barrow et al. |
| 2011/0084623 | A1 | 4/2011 | Barrow |
| 2011/0115395 | A1 | 5/2011 | Barrow et al. |
| 2011/0121754 | A1 | 5/2011 | Shteynberg |
| 2011/0148318 | A1 | 6/2011 | Shackle et al. |
| 2011/0204797 | A1 | 8/2011 | Lin et al. |
| 2011/0204803 | A1 | 8/2011 | Grotkowski et al. |
| 2011/0234115 | A1 | 9/2011 | Shimizu et al. |
| 2011/0266968 | A1 | 11/2011 | Bordin et al. |
| 2011/0291583 | A1 | 12/2011 | Shen |
| 2011/0309759 | A1 | 12/2011 | Shteynberg et al. |
| 2012/0025729 | A1 | 2/2012 | Melanson et al. |
| 2012/0049752 | A1 | 3/2012 | King et al. |
| 2012/0068626 | A1 | 3/2012 | Lekatsas et al. |
| 2012/0286686 | A1 | 11/2012 | Watanabe et al. |
| 2013/0154495 | A1 | 6/2013 | He |

FOREIGN PATENT DOCUMENTS

| | | |
|---|---|---|
| EP | 2232949 | 9/2010 |
| EP | 2257124 A1 | 12/2010 |
| JP | 2008053181 A | 3/2008 |
| JP | 2009170240 A | 7/2009 |
| WO | WO 02/096162 A1 | 11/2002 |
| WO | WO 2006/079937 A1 | 8/2006 |
| WO | 2008029108 | 3/2008 |
| WO | 2010011971 A1 | 1/2010 |
| WO | WO 2010027493 A2 | 3/2010 |
| WO | WO 2010/035155 A2 | 4/2010 |
| WO | WO 2011/008635 A1 | 1/2011 |
| WO | WO 2011/050453 A1 | 5/2011 |
| WO | WO 2011/056068 A2 | 5/2011 |
| WO | WO 2012/016197 A1 | 2/2012 |

OTHER PUBLICATIONS

Azoteq, IQS17 Family, IQ Switch—ProxSense Series, Touch Sensor, Load Control and User Interface, IQS17 Datasheet V2.00.doc, Jan. 2007, pp. 1-51, Azoteq (Pty) Ltd., Paarl, Western Cape, Republic of South Africa.

Chan, Samuel, et al, Design and Implementation of Dimmable Electronic Ballast Based on Integrated Inductor, IEEE Transactions on Power Electronics, vol. 22, No. 1, Jan. 2007, pp. 291-300, Dept. of Electron. Eng., City Univ. of Hong Kong.

Rand, Dustin, et al, Issues, Models and Solutions for Triac Modulated Phase Dimming of LED Lamps, Power Electronics Specialists Conference, 2007. PESC 2007. IEEE, Jun. 17-21, 2007, pp. 1398-1404, Boston, MA, USA.

Gonthier, Laurent, et al, EN55015 Compliant 500W Dimmer with Low-Losses Symmetrical Switches, ST Microelectronics, Power Electronics and Applications, 2005 European Conference, pp. 1-9, Aug. 7, 2006, Dresden.

Green, Peter, A Ballast That Can Be Dimmed from a Domestic (Phase Cut) Dimmer, International Rectifier, IRPLCFL3 rev.b, pp. 1-12, Aug. 15, 2003, El Segundo, California, USA.

Hausman, Don, Real-Time Illumination Stability Systems for Trailing-Edge (Reverse Phase Control) Dimmers, Lutron RTISS, Lutron Electronics Co, Dec. 2004, pp. 1-4, Coopersburg, PA, USA.

Lee, Stephen, et al, A Novel Electrode Power Profiler for Dimmable Ballasts Using DC Link Voltage and Switching Frequency Controls, IEEE Transactions on Power Electronics, vol. 19, No. 3, May 2004, pp. 847-833, City University of Hong Kong.

Engdahl, Tomi, Light Dimmer Circuits, 1997-2000, www.epanorama.net.

O'Rourke, Conan, et al, Dimming Electronic Ballasts, National Lighting Product Information Program, Specifier Reports, vol. 7, No. 3, Oct. 1999, pp. 1-24, Troy, NY, USA.

Supertex Inc, 56W Off-line LED Driver, 120VAC with PFC, 160V, 350mA Load, Dimmer Switch Compatible, DN-H05, pp. 1-20, Jun. 17, 2008, Sunnyvale, California, USA.

Why Different Dimming Ranges, http://www.lutron.com/TechnicalDocumentLibrary/LutronBallastpg3.pdf.

Wu, Tsai-Fu, et al, Single-Stage Electronic Ballast with Dimming Feature and Unity Power Factor, IEEE Transactions on Power Electronics, vol. 13, No. 3, May 1998, pp. 586-597.

Engdahl, Tomi, Light Dimmer Circuits, 1997-2000, downloaded from www.epanorama.net.

"Why Different Dimming Ranges?", 2003, downloaded from http://www.lutron.com/TechnicalDocumentLibrary/LutronBallastpg3.pdf.

Adrian Z Amanci, et al. "Synchronization System with Zero-Crossing Peak Detection Algorithm for Power System Applications." 2010 IPEC Conference. Jun. 2010. pp. 2884-2991. Publisher: IEEE. Piscataway, NJ, USA.

U.S. Appl. No. 13/537,301, filed Jun. 29, 2012, Melanson, et al.

Patterson, James. "Efficient Method for Interfacing Triac Dimmers and LEDs", EDN Network, Jun. 23, 2011, 4 pages (pp. 1-4 in pdf), National Semiconductor Corp., UBM Tech.

* cited by examiner

DUTY FACTOR PROBING OF A TRIAC-BASED DIMMER

The present U.S. patent application claims priority under 35 U.S.C. §119(e) to U.S. Provisional Patent Application Ser. No. 61/410,269 filed on Nov. 4, 2010. The present U.S. patent application also claims priority under 35 U.S.C. §120 to U.S. patent application Ser. No. 13/194,531 entitled "POWERING HIGH-EFFICIENCY LIGHTING DEVICES FROM A TRIAC-BASED DIMMER", filed on Jul. 29, 2011 and to U.S. patent application Ser. No. 12/858,164 entitled "DIMMER OUTPUT EMULATION", filed on Aug. 17, 2010, each having at least one common inventor with the present U.S. patent application and which are assigned to the same Assignee. Therefore, the present U.S. patent application is a Continuation-in-Part of the above-referenced non-provisional U.S. patent applications, the disclosures of which are incorporated herein by reference.

BACKGROUND OF THE INVENTION

1. Field of the Invention

The present invention relates generally to lighting device power sources such as those included within dimmable light emitting diode lamps, and in particular to a lighting device power source that provides a correct measure of the duty factor of a triac-based dimmer while powering high-efficiency lighting devices.

2. Background of the Invention

Lighting control and power supply integrated circuits (ICs) are in common use in both electronic systems and in replaceable consumer lighting devices, e.g., light-emitting-diode (LED) and compact fluorescent lamp (CFL) replacements for traditional incandescent light bulbs.

In particular, in dimmable high-efficiency replacement light bulbs, the low energy requirements of the lighting devices makes it difficult for the typical thyristor-based dimmers to operate properly, as the triac circuit that implements the typical dimmer is designed for operation with a load that requires on the order of ten times the current required by the typical high-efficiency lighting device. Therefore, dimmable high-efficiency replacement lighting device circuits must ensure that the dimmer operates properly in conjunction with the lighting devices, i.e., supplies a sufficient amount of energy and provides a needed indication of the dimming level, so that dimming of the lighting devices can be performed.

Therefore, it would be desirable to provide a dimmable high-efficiency lighting device power source circuit that provides proper operation of a triac-based dimmer circuit and also provides the proper dimming level.

SUMMARY OF THE INVENTION

The invention is embodied in a circuit for supplying power to high efficiency lighting devices from a thyristor-controlled dimmer, an IC including such a power supply circuit and a method of operation of the power supply circuit.

The power supply circuit includes a circuit that probes the output of the dimmer from the turn-on time of the dimmer until enough information has been gathered to correctly predict a next zero-crossing of the AC line voltage that supplies the dimmer. The dimming value is determined from the time between the predicted zero crossing and the next turn-on time of the dimmer. The frequency of the AC line voltage can be determined from the time interval between the predicted zero crossings. The probing can be performed intermittently so that during most cycles of the AC line voltage, the triac in the dimmer is not activated, improving efficiency.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses circuits and methods for powering and controlling lighting devices. In particular embodiments, strings of light-emitting diodes (LEDs) are packaged to replace incandescent lamps, and the energy supplied to the LED strings is varied in accordance with a dimming value determined from operation of a thyristor-controlled dimmer supplying the replacement lighting device, so that dimmed operation is achieved. The present invention achieves dimming operation efficiently, while still correctly determining the dimming setting of the dimmer, i.e., the dimming value by probing the output of the dimmer periodically or intermittently. The dimming value is needed to determine the amount of current to supply to the LED strings and must be determined initially and tracked as changes occur in the dimmer setting. Further, periodically it is desirable to ensure that the dimming value has been estimated correctly, so that errors and drift are reduced or eliminated. The probing is performed by applying an impedance level that ensures proper operation of the timing circuits in the dimmer, i.e., an impedance less than or equal to a specified value to maintain the dimmer circuits in proper operation, while determining a time interval extending from the leading edge of the dimmer output to a predicted zero-crossing time of the AC voltage source that provides power to the dimmer. The probing can extend across the balance of the half-cycle of the AC voltage source, or may be terminated as soon as sufficient information has been gathered to correctly predict the zero-crossing time. Periodic probing can be performed at intervals of an odd number of half-cycles of the AC voltage source, in order to eliminate any DC offset from accumulating in the dimmer's timing circuits.

Figure 1:
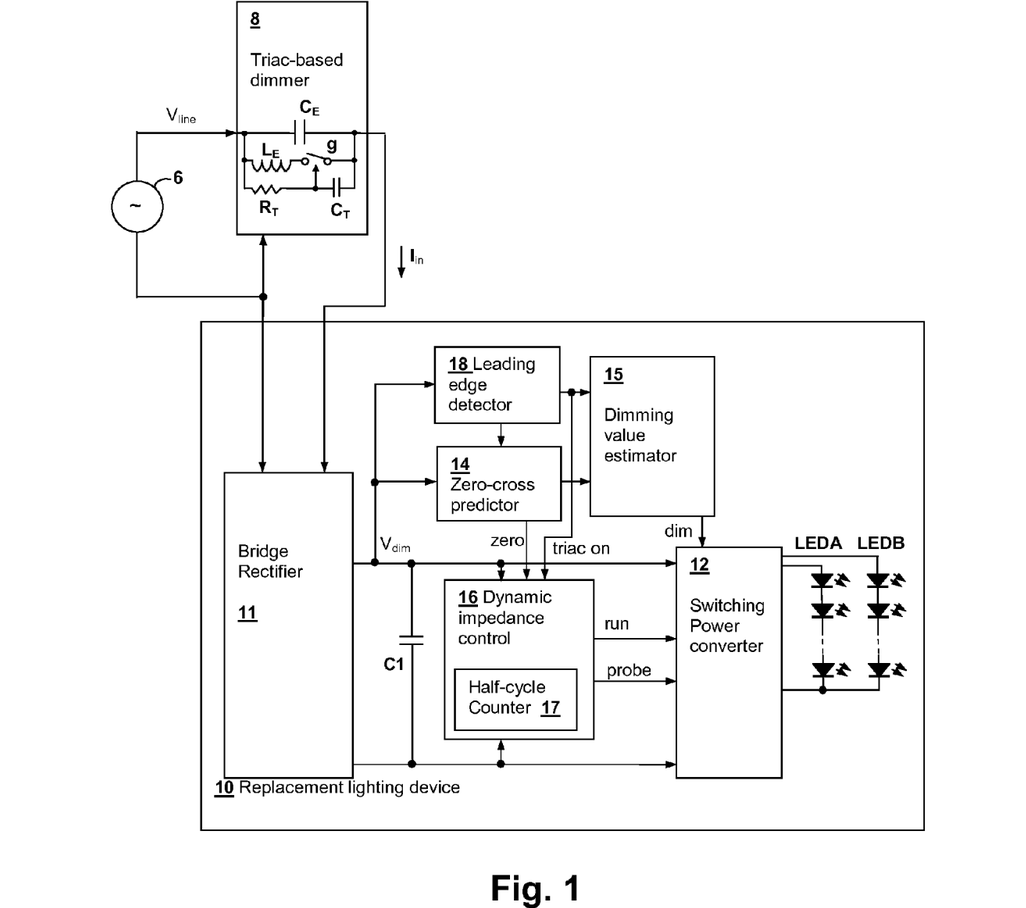
FIG. 1 is a block diagram depicting a lighting circuit in accordance with an embodiment of the present invention.

Referring now to FIG. 1, a lighting circuit in accordance with an embodiment of the invention is shown. An AC power line source 6 provides an AC line voltage $V_{line}$ to a replacement lighting device 10 through a triac-based dimmer 8 that is, for example, designed for operation with incandescent bulbs having a power consumption of 40 W or greater. Replacement lighting device 10 uses LEDs LEDA, LEDB, to supply light, which may be strings of LEDs connected in series as shown. Since even a 100 W equivalent high-efficiency replacement bulb using LEDs consumes only 13 W of power, the current level of an LED replacement lamp will be less than 1/3 of that conducted through the minimum specified wattage incandescent bulb, and may be as low as 1/10th the current. Therefore, the triac in triac-based dimmer 8 can fail to trigger properly due to the reduced current conducted through the triac at the time triac-based dimmer 8 turns on. In replacement lighting device 10, the dimming value of triac-based dimmer 8 is determined from the width of the cut sine wave of rectified dimmer output voltage $V_{dim}$, and is then used to control the magnitude of the current applied to LEDs LEDA, LEDB. Therefore, obtaining a correct dimming value is dependent on the timing circuit in triac-based dimmer 8 properly timing the position of the leading edge of the cut sine wave of rectified dimmer output voltage $V_{dim}$ at least until the time of the next zero-crossing of AC line voltage $V_{line}$ is correctly determined.

Within the block depicting triac-based dimmer 8, a model equivalent circuit is shown that is useful for describing the operation of the triac and timing circuits within an actual triac-based dimmer. The switch g illustrates operation of the triac itself, which alternately conducts current $I_{in}$ between AC power line source 6 and replacement lighting device 10. Initially, when switch g is open, EMI capacitor $C_E$ and the timing circuit formed by timing resistor $R_T$ and timing capacitor $C_T$ charge through the load applied at the output terminal of triac-based dimmer 8, which in ordinary operation is typically an incandescent bulb of 40 W or greater power consumption. Once capacitor $C_T$ is charged to a threshold voltage magnitude, switch g closes (i.e., the gate of the triac is triggered) and AC line voltage $V_{line}$ is provided to the output of triac-based dimmer through an inductor $L_E$, which is provided for EMI filtering and to reduce lamp buzz (acoustic noise in an incandescent filament). Once switch g is closed, switch g remains closed (i.e., the triac continues to conduct) until the magnitude of current $I_{in}$ conducted through triac-based dimmer 8 falls below the hold current of the triac. However, if an insufficiently low impedance load is connected to the output of the triac, the stored energy from capacitor $C_E$, which has been dumped into inductor $L_E$, will return to capacitor $C_E$ as the parallel combination of capacitor $C_E$ and inductor $L_E$ begins to oscillate. When the current through inductor $L_E$ falls below the hold current of the triac, the triac will turn off.

In order to prevent the above-described mis-triggering, e.g. premature turn-off, of triac-based dimmer 8, replacement lighting device 10 includes a dynamic impedance control circuit 16 that applies a damping impedance level sufficient to prevent the re-triggering of the triac in triac-based dimmer 8. A leading edge detector 18 detects a rise in rectified dimmer output voltage $V_{dim}$ caused by a turn-on event of triac-based dimmer 8 and asserts a control signal triac on, in response to which dynamic impedance control 16 applies a sufficiently low damping impedance level to prevent the re-triggering of the triac in triac-based dimmer 8 by damping the resonant circuit formed by capacitor $C_E$ and inductor $L_E$. The impedance at the input of replacement lighting device 10 is maintained at or below the requisite damping impedance level until a predetermined time period has passed. The predetermined time period is determined for the range of triac-based dimmer 8 designs with which the replacement lighting device must operate, and the circuit conditions present in replacement lighting device 10, but is generally on the order of 200 μS in duration. The requisite damping impedance level also varies with the particular design of triac-based dimmer 8, but is generally between 100 ohms and 1 k ohms. After the predetermined time period has passed, replacement lighting device 10 need only draw enough current to maintain the triac-based dimmer in a conducting state while energy needed to supply LEDs LEDA, LEDB for the cycle is being transferred. The minimum current required to maintain the conducting state is the hold current of the particular triac in triac-based dimmer 8 is generally between 25 and 70 milliamperes. After energy is transferred, replacement lighting device 10 then enters a high impedance state, disabling switching power converter 12 so that a sudden change in impedance due to activation of switching power converter 12 does not trigger triac-based dimmer 8 by re-charging capacitor $C_T$ to the trigger threshold during any remaining portion of the half-cycle of AC line voltage $V_{line}$ for which the corresponding triac output cycle already been terminated.

In order to ensure that the next leading edge of the output of triac-based dimmer 8 occurs at the correct time, proper operation of the timer circuit formed by capacitor $C_T$ and resistor $R_T$ must be ensured. At the next zero-crossing time of AC line voltage $V_{line}$, and from that time until triac-based dimmer 8 turns on, a path for the input current $I_{in}$ that is charging timing capacitor $C_T$ must be provided at the input of replacement lighting device 10. Further, the impedance presented at the output of triac-based dimmer 8 must be low enough to not generate a voltage drop across the inputs of replacement lighting device 10 that would substantially affect the trigger point of the triac, e.g., the time at which switch g closes. In order to prevent the above-described mis-operation of triac-based dimmer 8, replacement lighting device 10 includes a zero-cross prediction circuit 14 that predicts or detects a zero-cross time of AC line voltage $V_{line}$ by observing dimmer output voltage $V_{dim}$, and dynamic impedance control circuit 16 ensures that a sufficiently low impedance, referred to as the "glue" impedance herein, is presented at the input terminals of replacement lighting device from the zero-cross time until the turn-on event is detected by leading edge detection circuit 18, during a time referred to herein as the "glue interval". Thus, dynamic impedance control circuit 16, by applying the glue impedance during the glue intervals, ensures that the timing of the timing circuit in triac-based dimmer 8 is not disrupted by the absence of a passive low-impedance load such as an incandescent light bulb, at the output of the dimmer, while avoiding dissipating excess energy by applying the glue impedance only during the glue interval during which the triac in triac-based dimmer 8 is off. Since the depicted embodiment determines the duty factor of triac-based dimmer 8 from the time period between the zero-crossing and the turn-on time of the triac in triac-based dimmer 8, an accurate estimate or measurement of the zero-cross time must be determined.

During probing intervals, which occur after the triac in triac-based dimmer 8 has turned on, another specified minimum "probing" conductance (maximum probing impedance) is applied to the output of triac-based dimmer 8 until the time of the next zero-cross time of AC line voltage $V_{line}$ is accurately determined. The probing impedance is applied to ensure that the triac in triac-based dimmer 8 remains on and that the timing circuit in triac-based dimmer 8 continues to operate accurately. The probing interval may extend all the way to the zero-cross time, or may be terminated once the prediction is accurately made, which is generally after the peak of AC line voltage $V_{line}$, so that any ambiguity between different values of dimmer duty factor due to identical voltages at the leading edge can be resolved by knowing on which side of the peak of AC line voltage $V_{line}$ the leading edge of the output waveform of triac-based dimmer 8 occurs. A dimming value estimator 15 determines a dimming value for controlling the current supplied to LEDs LEDA, LEDB, by measuring the time interval between assertion of control signal triac on by leading edge detector 18 and the assertion of control signal zero by zero-cross detector, which is a direct measure of the duty factor of triac-based dimmer 8. Dynamic impedance control circuit 16 may be a controllable current sink, a resistor having a series-connected switching transistor, or other suitable circuit for shunting current across input terminals IN, or switching power converter 12 can be designed to provide a minimum conductance level during operation, and controlled such that the minimum conductance level is met during the probing intervals. The glue impedance needed to ensure proper timing is generally an impedance substantially equal to 100 ohms or less, which represents a conductance of less than or equal to 0.01 mhos. Such an impedance, if present across the dimmer output terminals during the active phase of triac-based dimmer would require power transfer or dissipation on the order of that caused by a 100 W light bulb, but since the glue impedance is applied while the triac is off, the power transfer is only that required to operate the timer circuit formed by capacitor $C_T$ and resistor $R_T$. However, the energy drawn by the minimum conductance level applied during the damping period (the damping impedance) and the minimum current drawn by switching power converter 12 during the active period still may be more energy than the energy needed to operate LEDs LEDA, LEDB.

In accordance with an embodiment of the present invention, a half-cycle counter 17 is provided within dynamic impedance control 16 and is used to periodically allow switching power converter 12 to operate, so that operation of switching power converter 12 is coordinated with the turn-on time of the triac in triac-based dimmer 8, but so that active cycles of triac-based dimmer 8 can be skipped except when it is necessary to probe triac-based dimmer 8 to properly detect the zero-cross time of AC line voltage $V_{line}$ and to operate switching power converter 12 to transfer sufficient energy to operate LEDs LEDA, LEDB. The glue impedance is still applied from the predicted zero-cross time until the turn-on time of triac-based dimmer 8 so that the internal circuits of triac-based dimmer will continue to operate properly during the idle time. Dynamic impedance control circuit 16 generates a control signal run, which permits switching power converter 12 to start energy transfer if energy transfer is needed. Dynamic impedance control circuit 16 also generates a control signal probe, which requires switching power converter 12 to present the minimum conductance level at the output of triac-based dimmer 8 so that a probing cycle is provided to accurately time the duty factor of triac-based dimmer 8. In order to prevent a DC offset from accumulating in the timing circuit of triac-based dimmer 8, control signal probe is asserted at intervals of odd half-cycles of AC line voltage $V_{line}$, so that switching power converter 12 will draw most of the energy from triac-based dimmer 8 during half-cycles of alternating polarity, any remaining requirements for transfer during subsequent assertions of control signal run should have a net zero effect, since any consistent operating pattern in the subsequent intervals of control signal run will also be applied to half-cycles of opposite polarity. In some embodiments of the invention, replacement lighting device 10 is designed so that switching power converter 12 will always operate when control signal run is asserted. In other embodiments of the invention, control signal run merely permits switching power converter 12 to operate if needed to replenish energy storage within switching power converter. Also, dynamic impedance control 16 may activate additional loading to provide the damping and/or probing impedance, or switching power converter 12 can be designed to always present a conductance no less than the conductance provided by the maximum damping impedance level. Alternatively, switching power converter 12 can have a non-uniform energy transfer characteristic so that more current is drawn during the damping time period than is drawn during the active time period.

Figure 2:
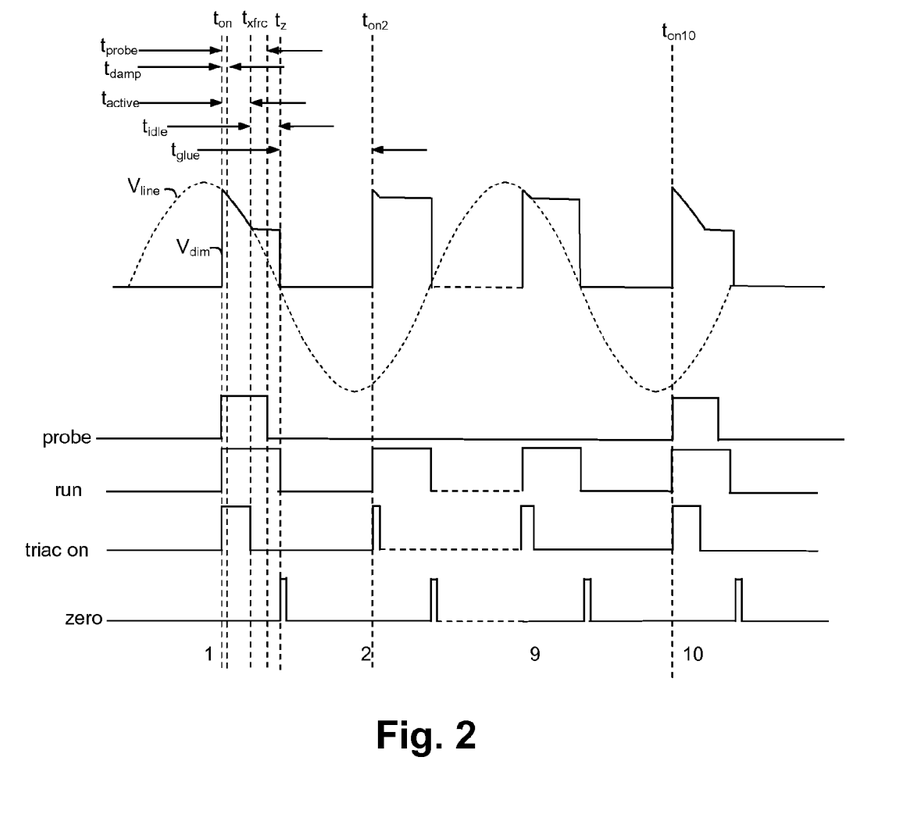
FIG. 2 is a signal waveform diagram illustrating the various phases of operation of lighting circuits in accordance with embodiments of the present invention.

Referring now to FIG. 2, the various phases of operation of replacement lighting device 10 are illustrated with reference to cycles of AC line voltage $V_{line}$ and the cut sine waveforms of rectified dimmer output voltage $V_{dim}$. During a predetermined time period $t_{damp}$, e.g. 100 µs, immediately following the triac turn-on event at time $t_{on}$, the damping impedance level is presented by operation of dynamic impedance control 16, when leading edge detector 18 detects the triac turn-on event and asserts control signal triac on. At least a portion of the damping impedance can be provided by operation of switching power converter 12 which operates during time period $t_{active}$ beginning just after time $t_{on}$. In the depicted embodiment, control signal run is provided to switching power converter 12 to indicate to switching power converter 12 both when switching power converter 12 is permitted to start an energy transfer cycle, and how long the cycle may potentially extend, i.e., the maximum duration of the active cycle is the duration of the high-state pulse of control signal run. Control signal run is asserted at time $t_{on}$ along with control signal probe, to require switching power converter 12 to present the minimum conductance at the output of triac-based dimmer so that the duty factor of triac-based dimmer can be probed. Once the possibility of resonant re-triggering of the triac has been avoided, e.g., after the energy associated with the turn-on event has been dissipated or stored for operating LEDs LEDA, LEDB, while energy is still needed by switching power converter 12 for the present cycle of AC line voltage $V_{line}$, transfer of energy is performed by switching power converter 12, and the current through triac-based dimmer 8 is maintained at or above the level of the hold current required by the triac in triac-based dimmer 8 at least throughout the remainder of the probing time period $t_{probe}$. After the energy transfer is complete at time $t_{xfrc}$, the input of replacement lighting device 10 enters a high-impedance state during idle time interval $t_{idle}$ and the triac in triac-based dimmer circuit 8 turns off. Then, once zero-crossing prediction circuit 14 indicates, by asserting control signal zero, that a zero-crossing of AC line voltage $V_{line}$ is occurring, dynamic impedance control 16 asserts the glue impedance at the output of triac-based dimmer 8, so that the timer circuit in triac-based dimmer 8 formed by capacitor $C_T$ and resistor $R_T$ will charge properly and generate the next leading edge of dimmer output voltage $V_{dim}$ at the proper time $t_{on2}$. At time $t_{on2}$, control signal probe is not asserted, and so energy transfer is only performed as needed at each assertion of control signal run until time $t_{on10}$, at which control signal probe is again asserted on the ninth half-cycle of AC line voltage $V_{line}$ after the previous assertion of control signal probe. Zero-cross prediction circuit 14 uses either analog techniques, such as multiple threshold comparators to trigger waveshape generators, e.g., a parabolic waveform generator that provides a close approximation to a sinusoidal waveshape, or digital techniques such as using an analog-to-digital converter (ADC) with a processing block that can extrapolate the zero crossing location from the shape of the cut sine waveform of dimmer output voltage $V_{dim}$. A relatively simple circuit can be used to implement the zero-crossing prediction circuit 14, since even a very low resolution ADC can be used to predict the zero-crossing location and generate control signal zero. A phase lock loop (PLL) can alternatively be used to predict the zero-crossing location by performing phase comparisons with the rectified dimmer output voltage $V_{dim}$ and a reference timer clock output. Using a PLL also can provide a consistent timebase for operation of half-cycle counter 17 and a measure of the frequency of AC line voltage $V_{line}$.

Figure 3:
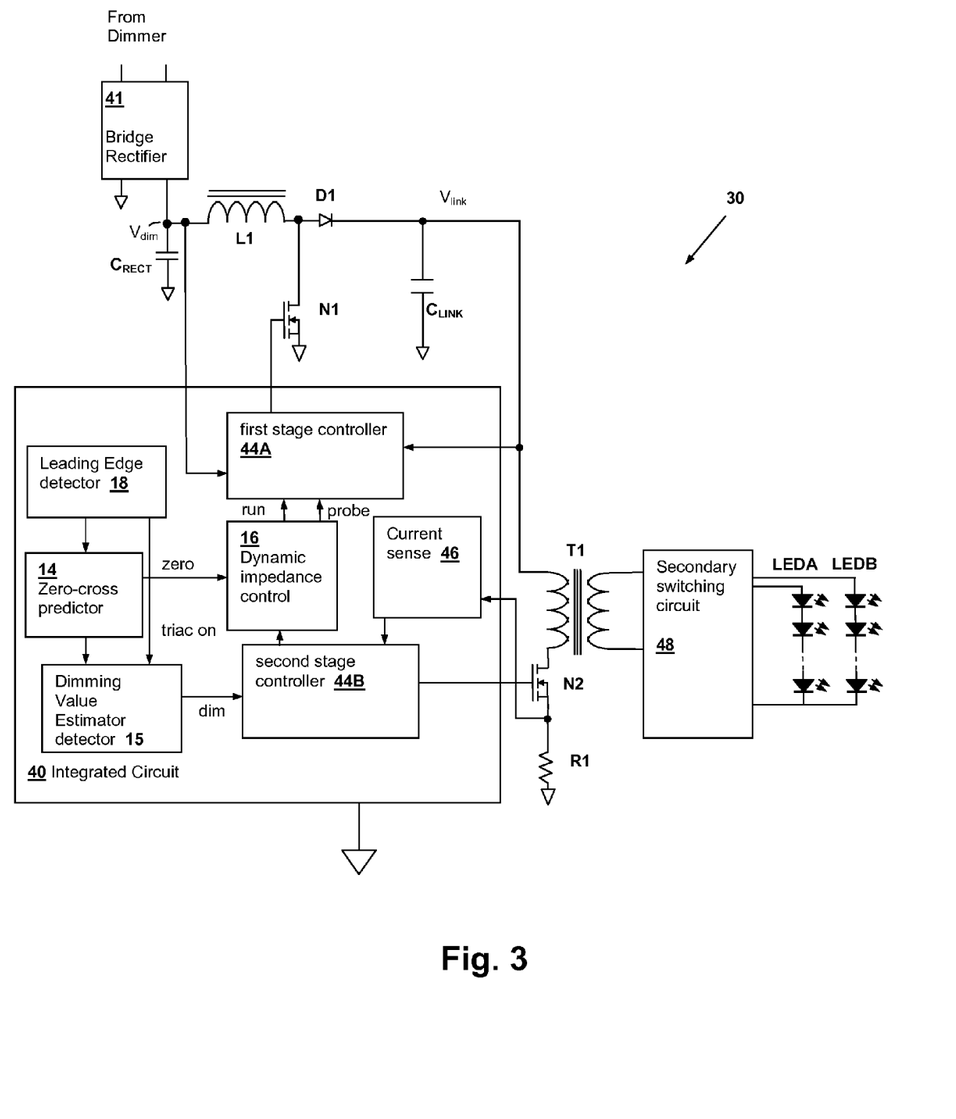
FIG. 3 is a simplified schematic diagram of a lighting circuit in accordance with another embodiment of the present invention.

Referring now to FIG. 3, a lighting circuit 30 in accordance with an embodiment of the present invention is shown. The circuit of FIG. 3 is provided to illustrate details of a two-stage switching power converter that may be used to implement switching power converter 12 of FIG. 1. The output of a dimmer is provided to a bridge rectifier 41 that generates a rectified dimmer output voltage $V_{dim}$. A capacitor $C_{RECT}$ provides filtering of higher frequency switching components generated by a buck input stage implemented by inductor L1, switching transistor N1, diode D1 and capacitor $C_{LINK}$. A resistor R1 provides for current-sensing of the primary current provided through transistor N2. An integrated circuit 40 provides control of transistor N1 from a first stage controller 44A and further controls a flyback converter stage from a second stage controller 44B that switches transistor N2 to provide current through a transformer T1 in response to feedback provided from current sensing circuit 46. Second stage controller provides information about energy requirements to dynamic impedance control circuit 16, which provides control indication to first stage controller 44A to dynamically control the impedance presented at the input terminal that receives the output of bridge rectifier 41, thereby controlling the impedance presented to the output of triac-controller dimmer 8. Zero-cross predictor 14, leading edge detector 18 and dimming value estimator 15 operate as described above with reference to FIG. 1. LEDs LEDA, LEDB may be supplied through a secondary switching circuit 48 that alternates application of the secondary current between LED strings, which may be of different color in order to provide a color profile that varies with the dimming value dim or under other control input. First stage controller 44A is activated by control signal run and control signal probe as described above.

Figure 4A:
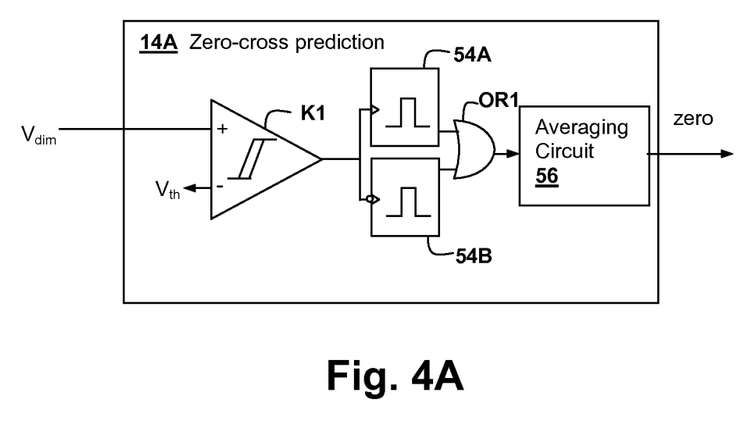
FIGS. 4A-4B are block diagrams of zero-cross determining circuits that may be used in circuits in accordance with embodiments of the invention.

Referring now to FIG. 4A, a zero-cross detection circuit 14A, as may be employed in the above-described embodiments of the invention is shown. A hysteresis comparator K1 detects when rectified dimmer output voltage $V_{dim}$ exceeds threshold voltage $V_{th}$, and one-shots 54A and 54B generate pulses that are combined by logical-OR gate OR1 to provide a pulse at each zero-crossing of AC line voltage $V_{line}$. An averaging circuit 56, such as a digital processing block or PLL, is included to reconstruct the input AC line voltage $V_{line}$ phase from the rectified dimmer output voltage $V_{DIM}$, which may be accomplished as described in the above-incorporated U.S. Patent Application entitled "DIMMER OUTPUT EMULATION." The output of zero-cross prediction circuit 14A is a pulse that is asserted at the end of each half-cycle of AC line voltage $V_{line}$, and indicates to one of the above-described circuits, when to apply the glue impedance or current level at the output of triac-based dimmer circuit 8.

Figure 4B:
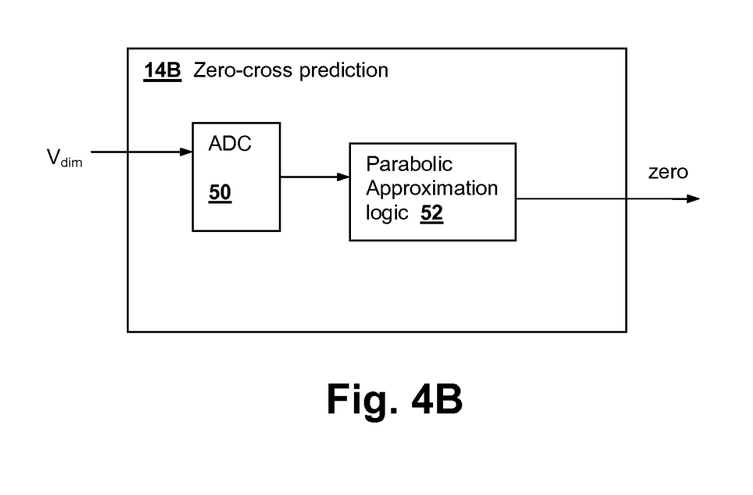

Referring now to FIG. 4B, an alternative zero-cross prediction circuit as may be employed in the above-described embodiments of the invention is shown. An ADC 50 provides input to parabolic approximation logic 52 that generates control signal zero according to the predicted location of the zero-crossings of AC line voltage $V_{line}$. ADC 50 may be replaced by a pair of comparators, and parabolic approximation logic 52 may be replaced by an analog circuit that performs piecewise approximation to approximate the waveshape of AC line voltage $V_{line}$ from the cut sine wave shape of rectified dimmer output voltage $V_{dim}$.

Figure 5:
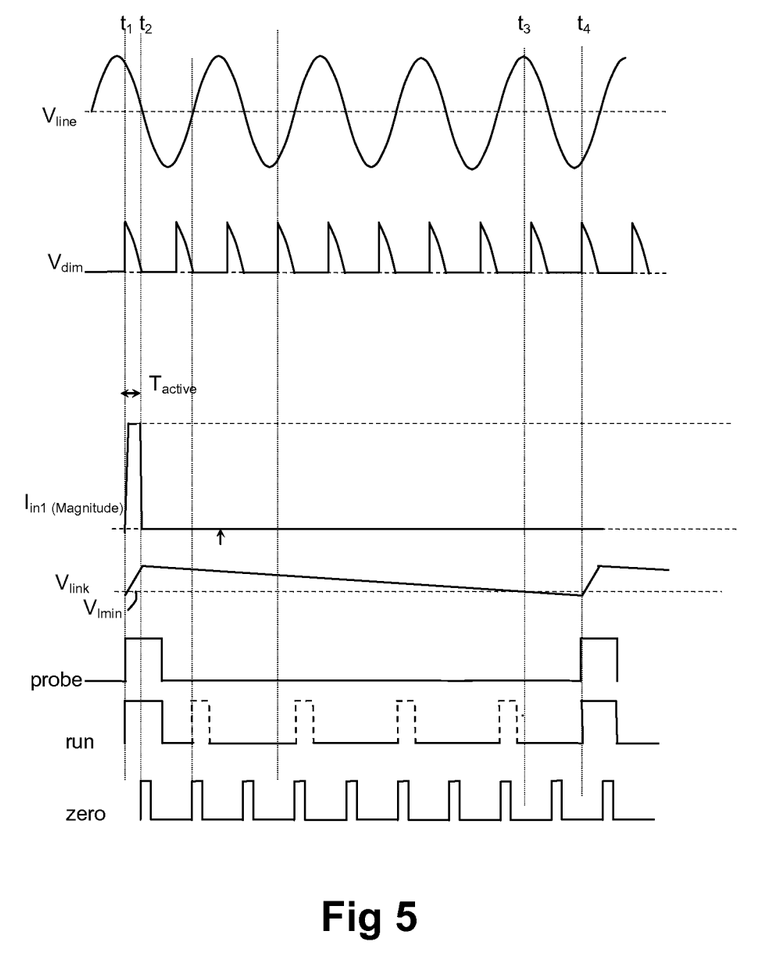
FIG. 5 is a signal waveform diagram illustrating signals within a lighting circuit in accordance with an embodiment of the present invention.

Referring now to FIG. 5, signals within the above-described embodiments of the invention are shown in a signal waveform diagram. At time $t_1$, a leading edge of rectified dimmer output voltage $V_{dim}$ indicates a triac turn-on event and for time period $t_{active}$, energy is drawn from the output terminals of triac-based dimmer 8 of FIG. 1. Current waveform $I_{in1}$ corresponds to an input current drawn by replacement lighting device 10 of FIG. 1, having a substantially constant value during the interval between times $t_1$ and $t_2$. Transitions in current waveform $I_{in1}$ cannot be too abrupt, or oscillation of EMI inductor $L_E$ and EMI capacitor $C_E$ can result, causing the triac to turn off at the wrong time. Voltage waveform $V_{link}$ corresponds to the output of first stage controller 44A in the circuit depicted in FIG. 3. At time $t_3$, link voltage $V_{link}$ has fallen below link threshold voltage $V_{1min}$ and at time $t_4$, the next odd-numbered half-cycle after the previous probing period begins, so first stage controller 44A is again activated to charge link capacitor $C_{LINK}$. Half-cycles prior to a particular numbered half-cycle of alternate polarity, during which control signal probe is asserted, can be enabled for operation of first stage controller 44A, in accordance with alternative embodiments of the invention, as shown by the dashed lines in control signal run. Otherwise, once the proper relationship between the actual power needed by LEDs LEDA, LEDB and the power level expected by triac-controller dimmer 8, a fixed relationship such as the 9th half-cycle scheme illustrated above, which is suitable for lighting devices that draw approximately 11% of the power consumed by an ordinary incandescent bulb, can be employed.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method of determining a dimming control value of a thyristor-switched dimmer, the method comprising:
   predicting zero-crossings of a voltage of an AC power source that supplies power to the thyristor-switched dimmer;
   probing the output of the thyristor-switched dimmer by periodically or intermittently applying a minimum conductance across the output of the thyristor-switched dimmer from a turn-on time of the thyristor-switched dimmer circuit at least until the predicting has gathered sufficient information to predict the next zero-cross time of the voltage of the AC power source;
   detecting a leading edge of a waveform of an output voltage of the thyristor-switched dimmer circuit subsequent to the next zero-cross time; and
   determining the dimming control value of the thyristor-switched dimmer from a time interval extending from the next zero-cross time of the voltage of the AC power source to the detected leading edge.

2. The method of claim 1, wherein the probing applies the minimum conductance until the next zero-cross time.

3. The method of claim 1, wherein the probing is performed at intervals corresponding to an odd number of half-cycles of the voltage of the AC power source.

4. The method of claim 1, wherein the probing applies the minimum conductance to the output of the thyristor-switched dimmer circuit by controlling a power converter that transfers power from the AC power source to one or more lighting devices such that the power converter control circuit transfers energy continuously during the durations of the probing cycles.

5. The method of claim 1, wherein the probing applies the minimum conductance to the output of the thyristor-switched dimmer circuit by controlling a controllable load impedance applied to the output of the thyristor-switched dimmer circuit.

6. An integrated circuit for operating a circuit that powers one or more lighting devices from an output of a thyristor-switched dimmer circuit, comprising:
a zero-crossing predicting circuit for predicting a next zero-cross time of a voltage of an AC power source that supplies power to the thyristor-switched dimmer circuit;
a probing control circuit that intermittently or periodically applies a minimum level of conductance to the output of the thyristor-switched dimmer circuit from a turn-on time of the thyristor-switched dimmer circuit at least until the zero-crossing predicting circuit has gathered sufficient information to predict the next zero-cross time of the voltage of the AC power source;
a detector for detecting a leading edge of a waveform of an output voltage of the thyristor-switched dimmer circuit subsequent to the next zero-cross time; and
a control circuit that determines the dimming control value of the thyristor-switched dimmer from a time interval extending from the next zero-cross time of the voltage of the AC power source to the detected leading edge.

7. The integrated circuit of claim 6, wherein the probing control circuit applies the minimum level of conductance until the next zero-cross time.

8. The integrated circuit of claim 6, wherein the probing control circuit applies the minimum level of conductance at intervals corresponding to an odd number of half-cycles of the voltage of the AC power source.

9. The integrated circuit of claim 6, wherein the probing control circuit applies the minimum level of conductance level to the output of the thyristor-switched dimmer circuit by controlling a power converter control circuit that powers the one or more lighting devices such that the power converter control circuit transfers energy continuously during the durations of the probing cycles.

10. The integrated circuit of claim 6, wherein the probing control circuit applies the minimum level of conductance to the output of the thyristor-switched dimmer circuit by controlling a controllable load impedance applied to the output of the thyristor-switched dimmer circuit.

11. A method of powering one or more lighting devices from an output of a thyristor-switched dimmer circuit, comprising:
converting power from the output of the thyristor-switched dimmer circuit to supply the one or more lighting devices;
predicting a next zero-cross time of a voltage of an AC power source that supplies power to the thyristor-switched dimmer circuit;
probing the output of the thyristor-switched dimmer by periodically or intermittently applying a minimum conductance across the output of the thyristor-switched dimmer during durations of probing cycles, wherein a rate of initiating the probing cycles is less than a half-cycle rate of an AC power source that supplies the thyristor-switched dimmer circuit, whereby some half-cycles of the AC power source are not probed, wherein the durations of the probing cycles extend from a turn-on time of the thyristor-switched dimmer circuit at least until the zero-crossing predicting circuit has gathered sufficient information to predict the next zero-cross time of the voltage of the AC power source.

12. The method of claim 11, further comprising:
detecting a leading edge of a waveform of an output voltage of the thyristor-switched dimmer circuit subsequent to the next zero-cross time; and
determining a dimming control value of the thyristor-switched dimmer from a time interval extending from the next zero-cross time of the voltage of the AC power source to the detected leading edge.

13. The method of claim 11, wherein the probing is performed at intervals corresponding to an odd number of half-cycles of the voltage of the AC power source.

14. The method of claim 11, wherein the probing applies the minimum conductance to the output of the thyristor-switched dimmer circuit by controlling the converting to transfer energy continuously during the durations of the probing cycles.

15. The method of claim 11, wherein the probing applies the minimum conductance to the output of the thyristor-switched dimmer circuit by controlling a controllable load impedance applied to the output of the thyristor-switched dimmer circuit.

16. An integrated circuit for operating a circuit that powers one or more lighting devices from an output of a thyristor-switched dimmer circuit, comprising:
a power converter control circuit for controlling a power converter for supplying the one or more lighting devices from the output;
a zero-crossing predicting circuit for predicting a next zero-cross time of a voltage of an AC power source that supplies power to the thyristor-switched dimmer circuit;
a probing control circuit that intermittently or periodically applies a minimum conductance to the output of the thyristor-switched dimmer circuit during durations of probing cycles, wherein a rate of initiating the probing cycles is less than a half-cycle rate of an AC power source that supplies the thyristor-switched dimmer circuit, whereby some half-cycles of the AC power source are not probed, wherein the durations of the probing cycles extend from a turn-on time of the thyristor-switched dimmer circuit at least until the zero-crossing predicting circuit has gathered sufficient information to predict the next zero-cross time of the voltage of the AC power source.

17. The integrated circuit of claim 16, further comprising:
a detector for detecting a leading edge of a waveform of an output voltage of the thyristor-switched dimmer circuit subsequent to the next zero-cross time; and
a control circuit that determines the dimming control value of the thyristor-switched dimmer from a time interval extending from the next zero-cross time of the voltage of the AC power source to the detected leading edge.

18. The integrated circuit of claim 16, wherein the probing control circuit applies the minimum conductance at intervals corresponding to an odd number of half-cycles of the voltage of the AC power source.

19. The integrated circuit of claim 16, wherein the probing control circuit applies the minimum conductance to the output of the thyristor-switched dimmer circuit by controlling the power converter control circuit such that the power converter control circuit transfers energy continuously during the durations of the probing cycles.

20. The integrated circuit of claim 16, wherein the probing control circuit applies the minimum conductance to the output of the thyristor-switched dimmer circuit by controlling a controllable load impedance applied to the output of the thyristor-switched dimmer circuit.

* * * * *